(12) United States Patent
Kim

(10) Patent No.: US 10,847,195 B2
(45) Date of Patent: *Nov. 24, 2020

(54) SEMICONDUCTOR DEVICE HAVING RANKS THAT PERFORMS A TERMINATION OPERATION

(71) Applicant: SK hynix Inc., Icheon-si (KR)

(72) Inventor: Jae Il Kim, Yongin-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/288,368

(22) Filed: Feb. 28, 2019

(65) Prior Publication Data

US 2019/0198073 A1 Jun. 27, 2019

Related U.S. Application Data

(63) Continuation of application No. 15/617,097, filed on Jun. 8, 2017, now Pat. No. 10,373,662.

(30) Foreign Application Priority Data

Jun. 27, 2016 (KR) .................. 10-2016-0080213

(51) Int. Cl.
G11C 7/22 (2006.01)
G11C 7/10 (2006.01)
G11C 5/06 (2006.01)
G11C 8/12 (2006.01)

(52) U.S. Cl.
CPC ............. *G11C 7/222* (2013.01); *G11C 7/109* (2013.01); *G11C 5/063* (2013.01); *G11C 8/12* (2013.01)

(58) Field of Classification Search
CPC ......... G11C 7/222; G11C 7/109; G11C 5/063; G11C 8/12
USPC .......................................................... 365/191
See application file for complete search history.

(56) References Cited

U.S. PATENT DOCUMENTS

| 4,811,305 | A | 3/1989 | Watanabe et al. |
| 6,000,004 | A | 12/1999 | Fukumoto |
| 6,975,547 | B2 | 12/2005 | Byeon et al. |
| 7,142,461 | B2* | 11/2006 | Janzen ................ G06F 13/4086 365/189.14 |
| 7,196,966 | B2* | 3/2007 | Jin ....................... G11C 7/1051 365/229 |
| 7,475,184 | B2 | 1/2009 | Lee |
| 7,656,722 | B2 | 2/2010 | Song |

(Continued)

FOREIGN PATENT DOCUMENTS

| KR | 101065336 B1 | 9/2011 |
| KR | 1020130031650 A | 3/2013 |

(Continued)

*Primary Examiner* — Sung Il Cho
(74) *Attorney, Agent, or Firm* — William Park & Associates Ltd.

(57) ABSTRACT

A semiconductor device includes a first rank and a second rank. The first rank operates in synchronization with a clock signal in response to a first rank selection signal, and the second rank operates in synchronization with the clock signal in response to a second rank selection signal. The first rank performs a termination operation without performing an internal control operation if the first rank selection signal maintains an enabled state in synchronization with a first edge and a second edge of the clock signal.

32 Claims, 11 Drawing Sheets

(56) References Cited

U.S. PATENT DOCUMENTS

| | | |
|---|---|---|
| 8,493,809 B2 | 7/2013 | Lee |
| 9,449,665 B1 | 9/2016 | Kim et al. |
| 10,115,441 B1 | 10/2018 | Yang et al. |
| 2001/0017806 A1 | 8/2001 | Schamberger et al. |
| 2002/0085419 A1 | 7/2002 | Kwon et al. |
| 2002/0185337 A1 | 12/2002 | Miura et al. |
| 2003/0099138 A1* | 5/2003 | Kyung ............... G11C 11/4076 365/200 |
| 2004/0049629 A1 | 3/2004 | Miura et al. |
| 2004/0090242 A1 | 5/2004 | Lee et al. |
| 2004/0123036 A1 | 6/2004 | Hammitt et al. |
| 2004/0179420 A1* | 9/2004 | Kyung ............... G11C 7/1078 365/233.1 |
| 2004/0193777 A1* | 9/2004 | LaBerge ............ G06F 13/4022 711/5 |
| 2005/0046139 A1 | 3/2005 | Guan |
| 2005/0047239 A1 | 3/2005 | Takahashi et al. |
| 2006/0002201 A1* | 1/2006 | Janzen ............... G06F 13/4086 365/191 |
| 2006/0023515 A1 | 2/2006 | Kishi et al. |
| 2006/0245287 A1 | 11/2006 | Seitz et al. |
| 2008/0164904 A1* | 7/2008 | Kim .................... G11C 7/1051 326/30 |
| 2008/0201548 A1 | 8/2008 | Przybylski et al. |
| 2008/0307132 A1 | 12/2008 | Zaks et al. |
| 2009/0097341 A1* | 4/2009 | Jeong ................. G11C 7/22 365/194 |
| 2009/0249097 A1* | 10/2009 | Lam ................... G11C 5/144 713/322 |
| 2009/0285034 A1* | 11/2009 | Fujisawa ............ G11C 7/22 365/189.05 |
| 2010/0054059 A1 | 3/2010 | Yoon et al. |
| 2010/0162053 A1 | 6/2010 | Gillingham |
| 2010/0182817 A1* | 7/2010 | Koshizuka .......... G11C 8/04 365/51 |
| 2010/0208534 A1 | 8/2010 | Fujisawa |
| 2010/0208535 A1* | 8/2010 | Fujisawa ............ G11C 11/4076 365/193 |
| 2010/0220536 A1 | 9/2010 | Coteus et al. |
| 2010/0302893 A1* | 12/2010 | Sato ................... G11C 11/4072 365/227 |
| 2011/0205832 A1* | 8/2011 | Jeon ................... G11C 7/222 365/233.16 |
| 2012/0127807 A1 | 5/2012 | Pio |
| 2012/0182816 A1 | 7/2012 | Ide et al. |
| 2012/0195144 A1 | 8/2012 | Ide et al. |
| 2012/0243365 A1 | 9/2012 | Kanda et al. |
| 2012/0272013 A1* | 10/2012 | Liou ................... G06F 13/1647 711/150 |
| 2012/0284480 A1* | 11/2012 | Williams ............ H01L 27/105 711/170 |
| 2013/0028038 A1 | 1/2013 | Fujisawa |
| 2013/0151757 A1 | 6/2013 | Beom |
| 2013/0297894 A1 | 11/2013 | Cohen et al. |
| 2014/0281135 A1 | 9/2014 | Balakrishnan et al. |
| 2014/0289448 A1 | 9/2014 | Koudele |
| 2014/0379961 A1 | 12/2014 | Lasser |
| 2014/0380015 A1 | 12/2014 | Lasser |
| 2015/0036439 A1 | 2/2015 | Lee |
| 2015/0213889 A1 | 7/2015 | Miura et al. |
| 2015/0228319 A1 | 8/2015 | Cheon |
| 2016/0071574 A1 | 3/2016 | Hess et al. |
| 2017/0110173 A1* | 4/2017 | Matsuno ............ G11C 11/4076 |
| 2019/0259431 A1 | 8/2019 | Penney et al. |
| 2020/0098422 A1 | 3/2020 | Nguyen et al. |
| 2020/0125257 A1 | 4/2020 | Shin et al. |

FOREIGN PATENT DOCUMENTS

| | | |
|---|---|---|
| KR | 1020150025782 A | 3/2015 |
| KR | 1020150095494 A | 8/2015 |
| KR | 1020160023359 A | 3/2016 |

* cited by examiner

SEMICONDUCTOR DEVICE HAVING RANKS THAT PERFORMS A TERMINATION OPERATION

CROSS-REFERENCE TO RELATED APPLICATIONS

The present application is a continuation application for U.S. patent application Ser. No. 15/617,097 and claims priority under 35 U.S.C. 119(a) to Korean Application No. 10-2016-0080213, filed on Jun. 27, 2016, which is incorporated herein by reference in its entirety.

BACKGROUND

1. Technical Field

Embodiments of the present disclosure relate to semiconductor devices performing a termination operation.

2. Related Art

Synchronous semiconductor devices may receive commands and addresses in synchronization with a clock signal. Double data rate (DDR) synchronous semiconductor devices may receive the commands and the addresses in synchronization with every rising edge and every falling edge of the clock signal, and single data rate (SDR) synchronous semiconductor devices may receive the commands and the addresses in synchronization with every rising edge of the clock signal.

SUMMARY

Various embodiments are directed to semiconductor devices performing a termination operation.

According to an embodiment, a semiconductor device includes a first rank and a second rank. The first rank operates in synchronization with a clock signal in response to a first rank selection signal, and the second rank operates in synchronization with the clock signal in response to a second rank selection signal. The first rank performs a termination operation without performing an internal control operation if the first rank selection signal maintains an enabled state in synchronization with a first edge and a second edge of the clock signal.

According to another embodiment, a semiconductor device includes a first command generation circuit and a second command generation circuit. The first command generation circuit generates a first command for execution of an internal control operation and a first termination command for execution of a termination operation from a first pre-command, in response to a first input control signal and a first termination enable signal. The second command generation circuit configured to generate a second command for execution of the internal control operation and a second termination command for execution of the termination operation from a second pre-command, in response to a second input control signal and a second termination enable signal.

BRIEF DESCRIPTION OF THE DRAWINGS

Various embodiments of the present disclosure will become more apparent in view of the attached drawings and accompanying detailed description, in which.

DETAILED DESCRIPTION OF THE EMBODIMENTS

Various embodiments of the present disclosure will be described hereinafter with reference to the accompanying drawings. However, the embodiments described herein are for illustrative purposes only and are not intended to limit the scope of the present disclosure.

Figure 1:
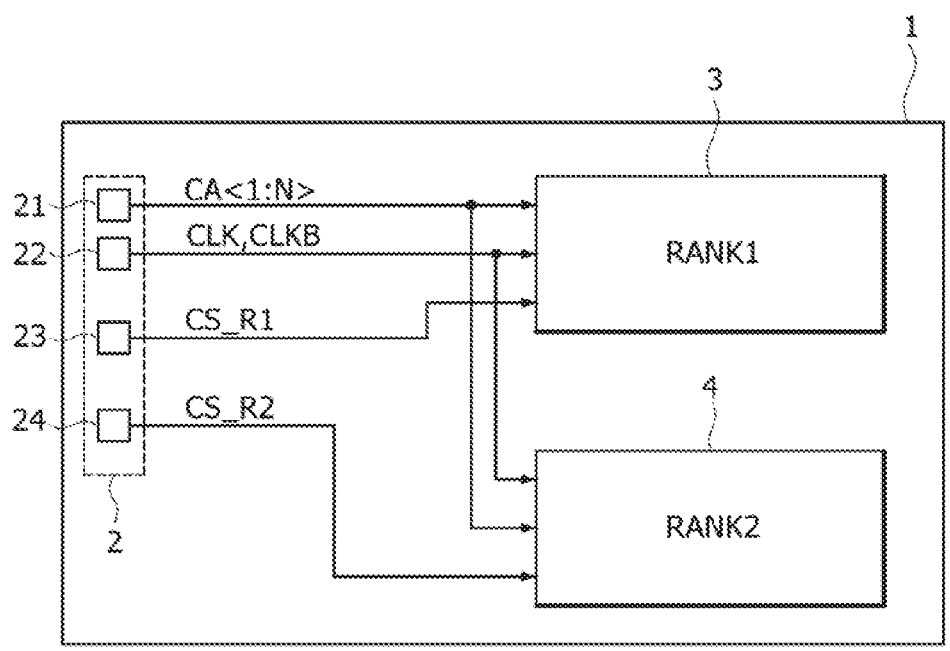
FIG. 1 is a block diagram illustrating a configuration of a semiconductor device according to an embodiment.

As illustrated in FIG. 1, a semiconductor device 1 according to an embodiment may include an input circuit 2, a first rank 3 and a second rank 4.

The input circuit 2 may include a first pin 21, a second pin 22, a third pin 23 and a fourth pin 24. The first pin 21 may receive a command/address signal CA<1:N> from an external device (not shown). The command/address signal CA<1:N> may include at least one of a command and an address which are outputted from the external device. The second pin 22 may receive a clock signal CLK and an inverted clock signal CLKB from the external device. Although the second pin 22 is illustrated as a single pin in FIG. 1, the second pin 22 may include a plurality of pins. The third pin 23 may receive a first rank selection signal CS_R1 from the external device. The first rank selection signal CS_R1 may be a signal which is enabled for operation of the first rank 3. The fourth pin 24 may receive a second rank selection signal CS_R2 from the external device. The second rank selection signal CS_R2 may be a signal which is enabled for operation of the second rank 4.

The first rank 3 may share the input circuit 2 with the second rank 4, where the first rank 3 and the second rank 4 receive the command/address signal CA<1:N>, the clock signal CLK and the inverted clock signal CLKB from the input circuit 2. The first rank 3 may perform an internal control operation on the semiconductor device 1 if the first rank selection signal CS_R1 is enabled in synchronization with an edge of the clock signal CLK. The internal control operation of the semiconductor device 1 may be any one of a mode register read operation, a read operation and a write operation. The first rank 3 may perform a termination operation without performing an internal control operation if the first rank selection signal CS_R1 maintains an enabled state in synchronization with at least one of a first edge and a second edge of the clock signal CLK, which are sequentially and continuously created. The second rank 4 may perform the internal control operation of the semiconductor device 1 if the second rank selection signal CS_R2 is enabled in synchronization with an edge of the clock signal CLK. The second rank 4 may perform the termination operation if the second rank selection signal CS_R2 maintains an enabled state in synchronization with edges of the clock signal CLK, which are sequentially and continuously created.

Figure 2:
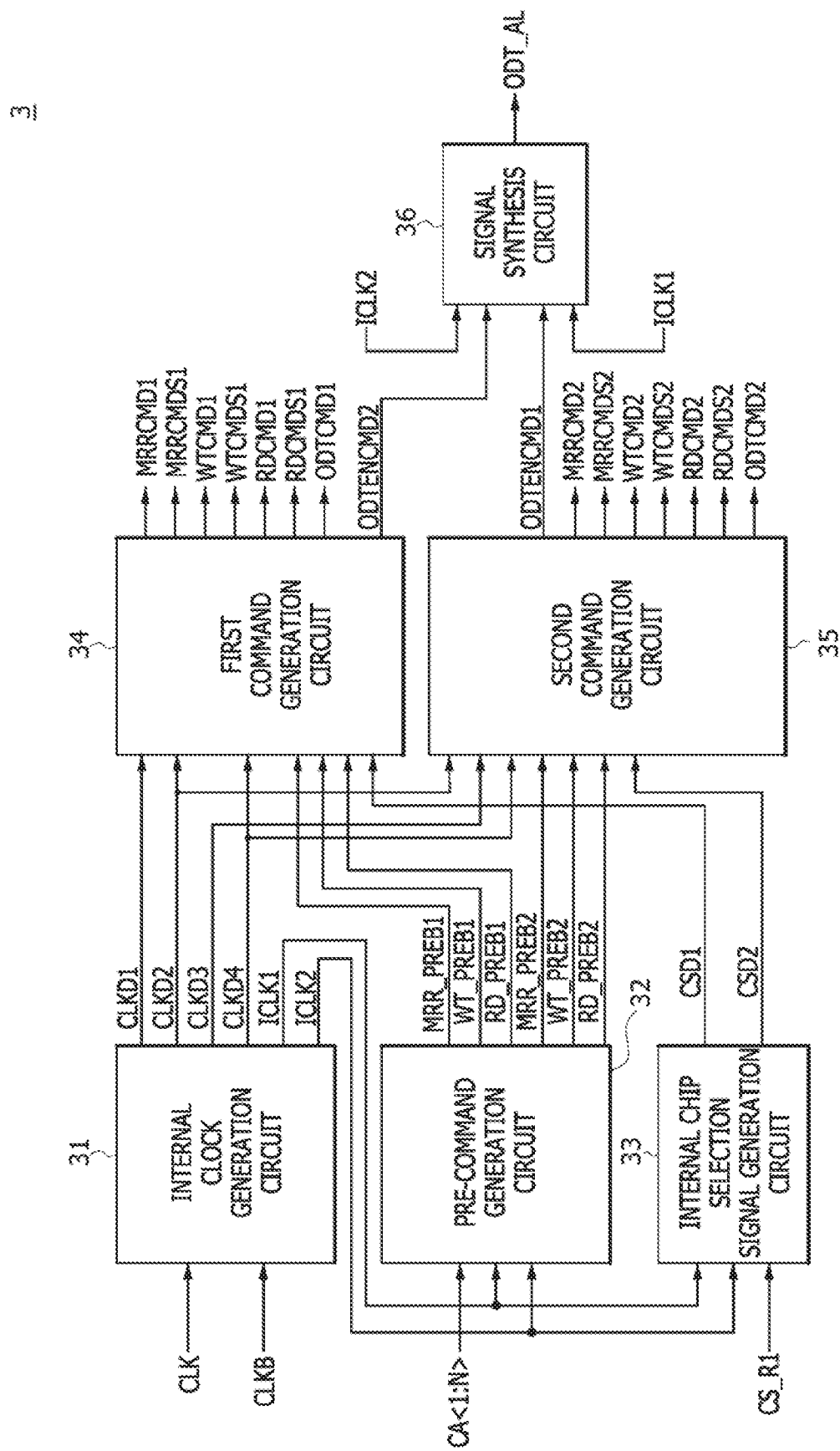
FIG. 2 is a block diagram illustrating a configuration of a first rank included in the semiconductor device of FIG. 1.

Referring to FIG. 2, the first rank 3 may include an internal clock generation circuit 31, a pre-command generation circuit 32, an internal chip selection signal generation circuit 33, a first command generation circuit 34, a second command generation circuit 35 and a signal synthesis circuit 36.

The internal clock generation circuit 31 may receive the clock signal CLK and the inverted clock signal CLKB to generate a first internal clock signal ICLK1, a second internal clock signal ICLK2, a first delayed clock signal CLKD1, a second delayed clock signal CLKD2, a third delayed clock signal CLKD3 and a fourth delayed clock signal CLKD4. The internal clock generation circuit 31 may divide the clock signal CLK and the inverted clock signal CLKB to generate the first internal clock signal ICLK1 and the second internal clock signal ICLK2. The first internal clock signal ICLK1 and the second internal clock signal ICLK2 may be generated to correspond to two-division signals that are set to have a cycle time which is twice the cycle time of the clock signal CLK and the inverted clock signal CLKB. The first internal clock signal ICLK1 may be set to have rising edges occurring in synchronization with an odd-number of rising edges (or even-number of rising edges according to some embodiments) of the clock signal CLK using a predetermined point of time as a reference point of time. The second internal clock signal ICLK2 may be set to have rising edges occurring in synchronization with an even-number of rising edges (or odd-number of rising edges according to some embodiments) of the clock signal CLK using the predetermined point of time as the reference point of time. The internal clock generation circuit 31 may delay the first internal clock signal ICLK1 to generate the first delayed clock signal CLKD1 and the second delayed clock signal CLKD2. A delay time for generating the first delayed clock signal CLKD1 from the first internal clock signal ICLK1 may be different from a delay time for generating the second delayed clock signal CLKD2 from the first internal clock signal ICLK1. In addition, the internal clock generation circuit 31 may delay the second internal clock signal ICLK2 to generate the third delayed clock signal CLKD3 and the fourth delayed clock signal CLKD4. A delay time for generating the third delayed clock signal CLKD3 from the second internal clock signal ICLK2 may be different from a delay time for generating the fourth delayed clock signal CLKD4 from the second internal clock signal ICLK2.

The pre-command generation circuit 32 may generate a first pre-command, such as a first pre-mode register read command MRR_PREB1, a first pre-write command WT_PREB1, a first pre-read command RD_PREB1, or a second pre-command, such as a second pre-mode register read command MRR_PREB2, a second pre-write command WT_PREB2 and a second pre-read command RD_PREB2 from the command/address signal CA<1:N>, in response to the first and second internal clock signals ICLK1 and ICLK2. The pre-command generation circuit 32 may latch and decode a buffered signal of the command/address signal CA<1:N> to generate the first pre-mode register read command MRR_PREB1, the first pre-write command WT_PREB1 and the first pre-read command RD_PREB1, in response to the first internal clock signal ICLK1. The first pre-mode register read command MRR_PREB1 may be set to be enabled for the mode register read operation which is performed in synchronization with a rising edge of the first internal clock signal ICLK1. The first pre-write command WT_PREB1 may be set to be enabled for the write operation which is performed in synchronization with a rising edge of the first internal clock signal ICLK1. The first pre-read command RD_PREB1 may be set to be enabled for the read operation which is performed in synchronization with a rising edge of the first internal clock signal ICLK1. The pre-command generation circuit 32 may latch and decode a buffered signal of the command/address signal CA<1:N> to generate the second pre-mode register read command MRR_PREB2, the second pre-write command WT_PREB2 and the second pre-read command RD_PREB2, in response to the second internal clock signal ICLK2. The second pre-mode register read command MRR_PREB2 may be set to be enabled for the mode register read operation which is performed in synchronization with a rising edge of the second internal clock signal ICLK2. The second pre-write command WT_PREB2 may be set to be enabled for the write operation which is performed in synchronization with a rising edge of the second internal clock signal ICLK2. The second pre-read command RD_PREB2 may be set to be enabled for the read operation which is performed in synchronization with a rising edge of the second internal clock signal ICLK2.

The internal chip selection signal generation circuit 33 may generate a first delayed chip selection signal CSD1 and a second delayed chip selection signal CSD2 from the first rank selection signal CS_R1 in response to the first internal clock signal ICLK1 and the second internal clock signal ICLK2. The internal chip selection signal generation circuit 33 may latch and delay a buffered signal of the first rank selection signal CS_R1 to generate the first delayed chip selection signal CSD1 in synchronization with the first internal clock signal ICLK1. In addition, the internal chip selection signal generation circuit 33 may latch and delay a buffered signal of the first rank selection signal CS_R1 to generate the second delayed chip selection signal CSD2 in synchronization with the second internal clock signal ICLK2.

The first command generation circuit 34 may generate a first mode register read command MRRCMD1, a first shift mode register read command MRRCMDS1, a first write command WTCMD1, a first shift write command WTCMDS1, a first read command RDCMD1, a first shift read command RDCMDS1, a first termination command ODTCMD1 and a second termination enable command ODTENCMD2 from the first pre-mode register read command MRR_PREB1, the first pre-write command WT_PREB1 and the first pre-read command RD_PREB1. The first command generation circuit 34 may generate the first command in response to the first delayed clock signal CLKD1, the second delayed clock signal CLKD2, the fourth delayed clock signal CLKD4 and the first delayed chip selection signal CSD1. The first command generation circuit 34 may generate the first mode register read command MRRCMD1, the first shift mode register read command MRRCMDS1, the first write command WTCMD1, the first shift write command WTCMDS1, the first read command RDCMD1 and the first shift read command RDCMDS1, one of which is selectively enabled to perform the internal control operation in synchronization with the first delayed clock signal CLKD1, if an enabled first delayed chip selection signal CSD1 is inputted. The first mode register read command MRRCMD1 and the first shift mode register read command MRRCMDS1 may be enabled to perform the mode register read operation of the internal control operation. The first write command WTCMD1 and the first shift write command WTCMDS1 may be enabled to perform the write operation of the internal control operation. The first read command RDCMD1 and the first shift read command RDCMDS1 may be enabled to perform the read operation of the internal control operation. The first command generation circuit 34 may also generate the first termination command ODTCMD1 which is enabled if the internal control operation is performed. In such a case, the second termination enable command ODTENCMD2 may maintain a disabled state. The first command generation circuit 34 may generate the second termination enable command ODTENCMD2 which is enabled in synchronization with the first delayed clock signal CLKD1, if the first delayed chip selection signal CSD1 has an enabled state after a second termination command ODTCMD2 having an enabled state is generated by the second command generation circuit 35. Further, the first command generation circuit 34 may terminate generation of the first command and the first termination command ODTCMD1 if the second termination command ODTCMD2 is enabled. A first command may include the first mode register read command MRRCMD1, the first write command WTCMD1, and the first read command RDCMD1. A configuration and an operation of the first command generation circuit 34 will be described more fully with reference to FIG. 6 later.

The second command generation circuit 35 may generate a second mode register read command MRRCMD2, a second shift mode register read command MRRCMDS2, a second write command WTCMD2, a second shift write command WTCMDS2, a second read command RDCMD2, a second shift read command RDCMDS2, the second termination command ODTCMD2 and a first termination enable command ODTENCMD1 from the second pre-mode register read command MRR_PREB2, the second pre-write command WT_PREB2 and the second pre-read command RD_PREB2, in response to the second delayed clock signal CLKD2, the third delayed clock signal CLKD3, the fourth delayed clock signal CLKD4 and the second delayed chip selection signal CSD2. The second command generation circuit 35 may generate the second mode register read command MRRCMD2, the second shift mode register read command MRRCMDS2, the second write command WTCMD2, the second shift write command WTCMDS2, the second read command RDCMD2 and the second shift read command RDCMDS2, one of which is selectively enabled to perform the internal control operation in synchronization with the third delayed clock signal CLKD3, if an enabled second delayed chip selection signal CSD2 is inputted. The second mode register read command MRRCMD2 and the second shift mode register read command MRRCMDS2 may be enabled to perform the mode register read operation of the internal control operation. The second write command WTCMD2 and the second shift write command WTCMDS2 may be enabled to perform the write operation of the internal control operation. The second read command RDCMD2 and the second shift read command RDCMDS2 may be enabled to perform the read operation of the internal control operation. The second command generation circuit 35 may also generate the second termination command ODTCMD2 which is enabled if the internal control operation is performed. In such a case, the first termination enable command ODTENCMD1 may maintain a disabled state. The second command generation circuit 35 may generate the first termination enable command ODTENCMD1 which is enabled in synchronization with the third delayed clock signal CLKD3, if the second delayed chip selection signal CSD2 is enabled after an enabled first termination command ODTCMD1 is generated in the first command generation circuit 34. Further, the second command generation circuit 35 may terminate generation of the second command and the second termination command ODTCMD2 if the first termination command ODTCMD1 is enabled. A second command may include the second mode register read command MRRCMD2, the second write command WTCMD2, and the second read command RDCMD2. A configuration and an operation of the second command generation circuit 35 will be described more fully with reference to FIG. 7 later.

The signal synthesis circuit 36 may generate a termination latency signal ODT_AL from the first termination enable command ODTENCMD1 and the second termination enable command ODTENCMD2 in response to the first internal clock signal ICLK1 and the second internal clock signal ICLK2. The signal synthesis circuit 36 may shift the first termination enable command ODTENCMD1 to generate the termination latency signal ODT_AL in synchronization with the first internal clock signal ICLK1. The signal synthesis circuit 36 may shift the second termination enable command ODTENCMD2 to generate the termination latency signal ODT_AL in synchronization with the second internal clock signal ICLK2. The signal synthesis circuit 36 may shift the first termination enable command ODTENCMD1 to generate the termination latency signal ODT_AL if the first internal clock signal ICLK1 is enabled, and the signal synthesis circuit 36 may shift the second termination enable command ODTENCMD2 to generate the termination latency signal ODT_AL if the second internal clock signal ICLK2 is enabled.

Figure 3:
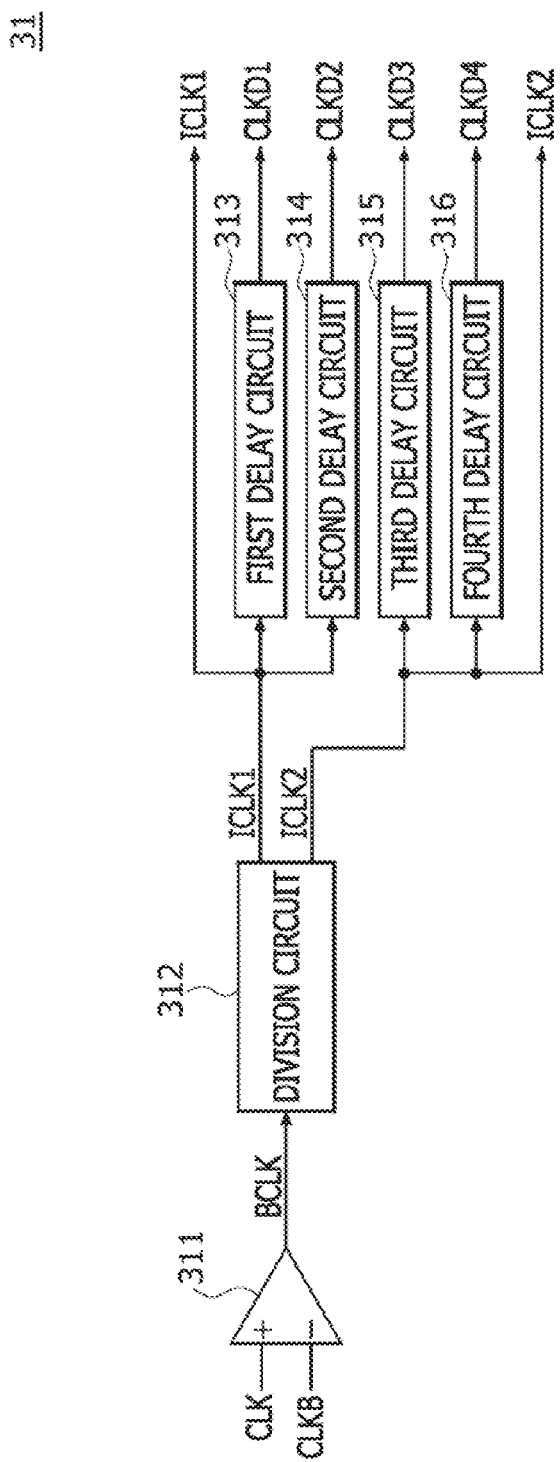
FIG. 3 is a block diagram illustrating a configuration of an internal clock generation circuit included in the first rank of FIG. 2.

Referring to FIG. 3, the internal clock generation circuit 31 may include a clock input buffer 311, a division circuit 312, a first delay circuit 313, a second delay circuit 314, a third delay circuit 315 and a fourth delay circuit 316.

The clock input buffer 311 may compare the clock signal CLK with the inverted clock signal CLKB to generate a buffered clock signal BCLK. The buffered clock signal BCLK may correspond to a signal which is generated by buffering the clock signal CLK.

The division circuit 312 may divide the buffered clock signal BCLK to generate the first internal clock signal ICLK1 and the second internal clock signal ICLK2. The first internal clock signal ICLK1 and the second internal clock signal ICLK2 may be generated to be two-division signals that are set to have a cycle time which is twice a cycle time of the clock signal CLK and the inverted clock signal CLKB. The first internal clock signal ICLK1 may be set to have rising edges occurring in synchronization with odd-numbered rising edges (or even-numbered rising edges according to some embodiments) of the clock signal CLK using a predetermined point of time as a reference point of time. The second internal clock signal ICLK2 may be set to have rising edges occurring in synchronization with even-numbered rising edges (or odd-numbered rising edges according to some embodiments) of the clock signal CLK using the predetermined point of time as the reference point of time.

The first delay circuit 313 may delay the first internal clock signal ICLK1 to generate the first delayed clock signal CLKD1. The second delay circuit 314 may delay the first internal clock signal ICLK1 to generate the second delayed clock signal CLKD2. The third delay circuit 315 may delay the second internal clock signal ICLK2 to generate the third delayed clock signal CLKD3. The fourth delay circuit 316 may delay the second internal clock signal ICLK2 to generate the fourth delayed clock signal CLKD4. Delay times of the first to fourth delay circuits 313, 314, 315 and 316 may be set to be different according to the embodiment.

Figure 4:
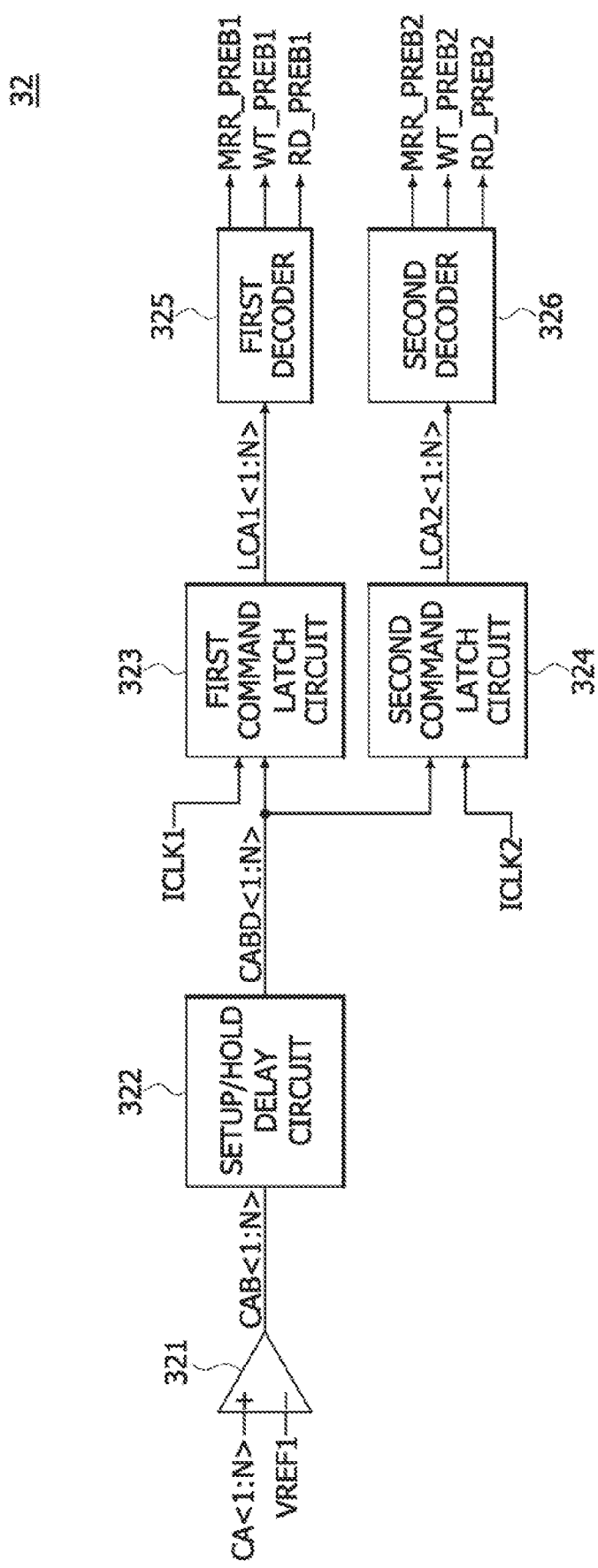
FIG. 4 is a block diagram illustrating a configuration of a pre-command generation circuit included in the first rank of FIG. 2.

Referring to FIG. 4, the pre-command generation circuit 32 may include a command input buffer 321, a setup/hold delay circuit 322, a first command latch circuit 323, a second command latch circuit 324, a first decoder 325 and a second decoder 326.

The command input buffer 321 may receive the command/address signal CA<1:N> to generate a buffered command/address signal CAB<1:N> in response to a first reference voltage VREF1. The command input buffer 321 may buffer the command/address signal CA<1:N> using the first reference voltage VREF1 as a reference voltage to generate the buffered command/address signal CAB<1:N>.

The setup/hold delay circuit 322 may delay the buffered command/address signal CAB<1:N> to generate a delayed command/address signal CABD<1:N>. The setup/hold delay circuit 322 may delay the buffered command/address signal CAB<1:N> for a predetermined delay time so that the delayed command/address signal CABD<1:N> is generated together with a setup/hold time.

The first command latch circuit 323 may latch the delayed command/address signal CABD<1:N> to generate a first latched command/address signal LCA1<1:N> in response to the first internal clock signal ICLK1. The first command latch circuit 323 may latch the delayed command/address signal CABD<1:N> in synchronization with a rising edge (or a falling edge according to some embodiments) of the first internal clock signal ICLK1.

The second command latch circuit 324 may latch the delayed command/address signal CABD<1:N> to generate a second latched command/address signal LCA2<1:N> in response to the second internal clock signal ICLK2. The second command latch circuit 324 may latch the delayed command/address signal CABD<1:N> in synchronization with a rising edge (or a falling edge according to some embodiments) of the second internal clock signal ICLK2.

The first decoder 325 may decode the first latched command/address signal LCA1<1:N> to generate the first pre-mode register read command MRR_PREB1, the first pre-write command WT_PREB1 and the first pre-read command RD_PREB1. One of the first pre-mode register read command MRR_PREB1, the first pre-write command WT_PREB1 and the first pre-read command RD_PREB1 may be selectively enabled according to a logic level combination of bits included in the first latched command/address signal LCA1<1:N>.

The second decoder 326 may decode the second latched command/address signal LCA2<1:N> to generate the second pre-mode register read command MRR_PREB2, the second pre-write command WT_PREB2 and the second pre-read command RD_PREB2. One of the second pre-mode register read command MRR_PREB2, the second pre-write command WT_PREB2 and the second pre-read command RD_PREB2 may be selectively enabled according to a logic level combination of bits included in the second latched command/address signal LCA2<1:N>.

Figure 5:
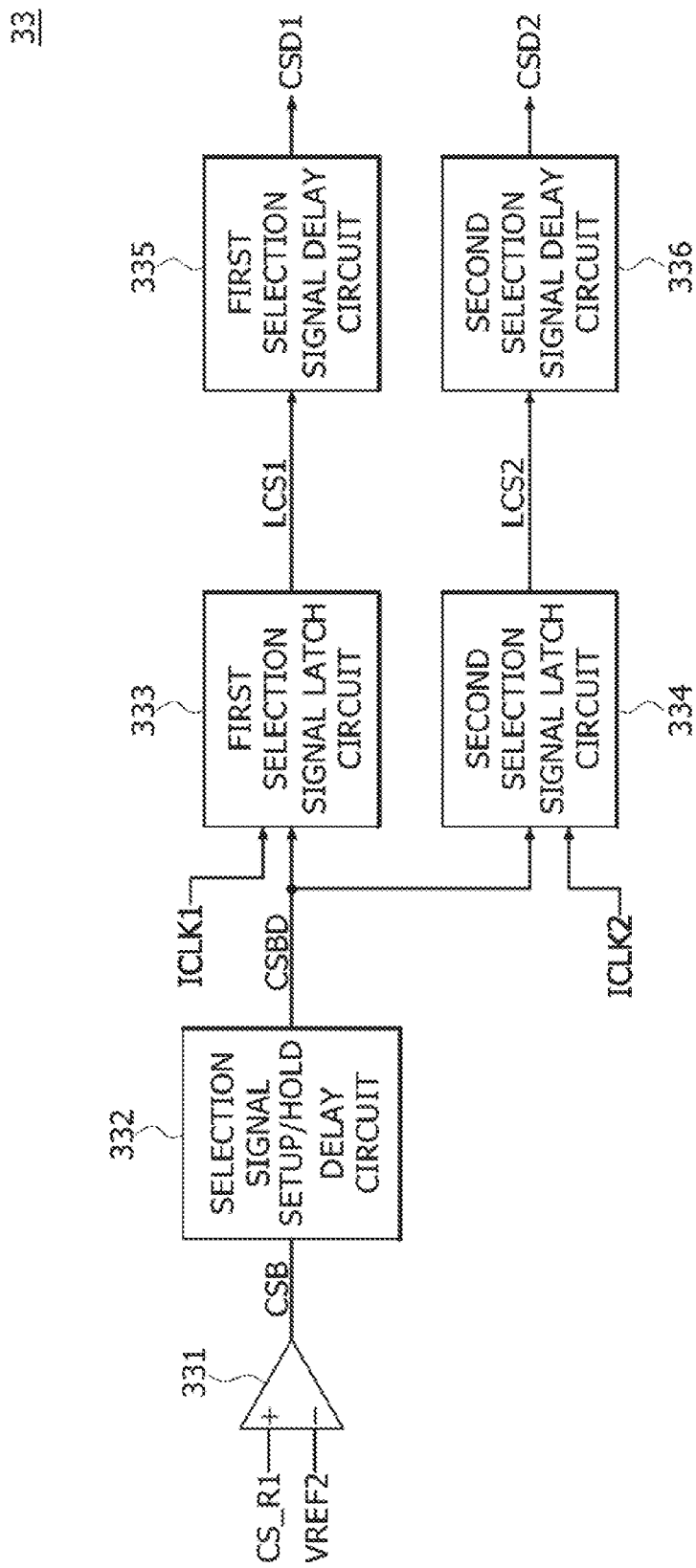
FIG. 5 is a block diagram illustrating a configuration of an internal chip selection signal generation circuit included in the first rank of FIG. 2.

Referring to FIG. 5, the internal chip selection signal generation circuit 33 may include a selection signal input buffer 331, a selection signal setup/hold delay circuit 332, a first selection signal latch circuit 333, a second selection signal latch circuit 334, a first selection signal delay circuit 335 and a second selection signal delay circuit 336.

The selection signal input buffer 331 may receive the first rank selection signal CS_R1 to generate a buffered selection signal CSB in response to a second reference voltage VREF2. The selection signal input buffer 331 may buffer the first rank selection signal CS_R1 using the second reference voltage VREF2 as a reference voltage to generate the buffered selection signal CSB.

The selection signal setup/hold delay circuit 332 may delay the buffered selection signal CSB to generate a delayed selection signal CSBD. The selection signal setup/hold delay circuit 332 may delay the buffered selection signal CSB for a predetermined delay time so that the delayed selection signal CSBD is generated together with the setup/hold time.

The first selection signal latch circuit 333 may latch the delayed selection signal CSBD to generate a first latched selection signal LCS1 in response to the first internal clock signal ICLK1. The first selection signal latch circuit 333 may latch the delayed selection signal CSBD in synchronization with a rising edge (or a falling edge according to some embodiments) of the first internal clock signal ICLK1.

The second selection signal latch circuit 334 may latch the delayed selection signal CSBD to generate a second latched selection signal LCS2 in response to the second internal clock signal ICLK2. The second selection signal latch circuit 334 may latch the delayed selection signal CSBD in synchronization with a rising edge (or a falling edge according to some embodiments) of the second internal clock signal ICLK2.

The first selection signal delay circuit 335 may delay the first latched selection signal LCS1 for a predetermined delay time to generate the first delayed chip selection signal CSD1. The predetermined delay time of the first selection signal delay circuit 335 may be set to be different according to the embodiment.

The second selection signal delay circuit 336 may delay the second latched selection signal LCS2 for a predetermined delay time to generate the second delayed chip selection signal CSD2. The predetermined delay time of the second selection signal delay circuit 336 may be set to be different according to the embodiment.

Figure 6:
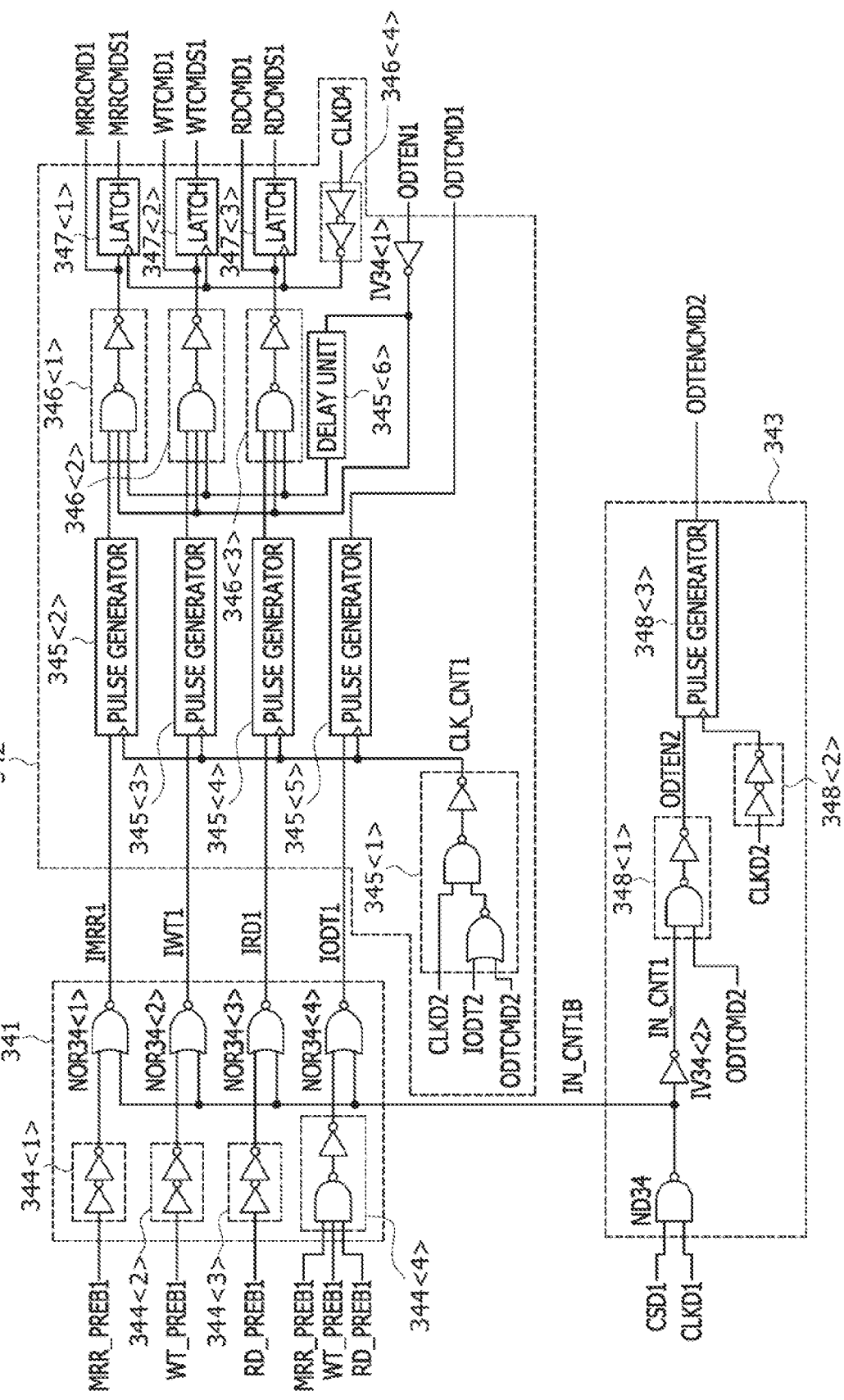
FIG. 6 is a block diagram illustrating a configuration of a first command generation circuit included in the first rank of FIG. 2.

Referring to FIG. 6, the first command generation circuit 34 may include a first internal command generation circuit 341, a first command output circuit 342 and a first input control signal generation circuit 343.

The first internal command generation circuit 341 may include buffers 344<1:4> and NOR gates NOR34<1:4>. The first internal command generation circuit 341 may generate at least one first internal command, such as, a first internal mode register read command IMRR1, a first internal write command IWT1, a first internal read command IRD1 and a first internal termination command IODT1 from the first pre-mode register read command MRR_PREB1, the first pre-write command WT_PREB1 and the first pre-read command RD_PREB1 while a first input control signal IN_CNT1B is enabled to have a logic "low" level. The first internal command generation circuit 341 may generate the first internal mode register read command IMRR1 and the first internal termination command IODT1 which are enabled to have a logic "high" level if the first pre-mode register read command MRR_PREB1 enabled to have a logic "low" level is inputted while the first input control signal IN_CNT1B is enabled to have a logic "low" level. The first internal command generation circuit 341 may generate the first internal write command IWT1 and the first internal termination command IODT1 which are enabled to have a logic "high" level if the first pre-write command WT_PREB1 enabled to have a logic "low" level is inputted while the first input control signal IN_CNT1B is enabled to have a logic "low" level. The first internal command generation circuit 341 may generate the first internal read command IRD1 and the first internal termination command IODT1 which are enabled to have a logic "high" level if the first pre-read command RD_PREB1, enabled to have a logic "low" level, is inputted while the first input control signal IN_CNT1B is enabled to have a logic "low" level.

The first command output circuit 342 may include a first control clock generator 345<1>, pulse generators 345<2:5>, an inverter IV34<1>, a delay unit 345<6>, logic units 346<1:3>, a buffer 346<4> and latches 347<1:3>. The first control clock generator 345<1> may generate a first control clock signal CLK_CNT1 having a logic "high" level while the second delayed clock signal CLKD2 has a logic "high" level and a second internal termination command IODT2 and the second termination command ODTCMD2 are disabled to have a logic "low" level. The pulse generators 345<2:4> may output pulses which are created when the first internal mode register read command IMRR1, the first internal write command IWT1 and the first internal read command IRD1, which are enabled, are inputted while the first control clock signal CLK_CNT1 having a logic "high" level is inputted. The pulse generator 345<5> may generate the first termination command ODTCMD1 for execution of a termination operation from a first pre-command, where the first termination command ODTCMD1 may be enabled if an enabled first internal termination command IODT1 is inputted while the first control clock signal CLK_CNT1 having a logic "high" level is inputted. The logic units 346<1:3> may generate the first mode register read command MRRCMD1, the first write command WTCMD1 and the first read command RDCMD1 in response to output signals of the inverter IV34<1> and the delay unit 345<6>. The logic units 346<1:3> may transmit the pulses generated in the pulse generators 345<2:4> to the latches 347<1:3> while a first termination enable signal ODTEN1 is disabled to have a logic "low" level. The logic units 346<1:3> may prevent the pulses generated in the pulse generators 345<2:4> from being transmitted to the latches 347<1:3>, while the first termination enable signal ODTEN1 is enabled to have a logic "high" level. Accordingly, the first command generation circuit 34 may terminate generation of the first command if the first termination enable signal ODTEN1 is enabled. The latches 347<1:3> may receive the pulses generated in the pulse generators 345<2:4> through the logic units 346<1:3> to generate the first shift mode register read command MRRCMDS1, the first shift write command WTCMDS1 and the first shift read command RDCMDS1, in synchronization with the fourth delayed clock signal CLKD4. The first command generation circuit 34 may be configured to generate the first command and the first termination command ODTCMD1 in response to the first input control signal IN_CNT1B and the first termination enable signal ODTEN1.

The first input control signal generation circuit 343 may include a NAND gate ND34, an inverter IV34<2>, a logic unit 348<1>, a buffer 348<2> and a pulse generator 348<3>. The NAND gate ND34 may generate the first input control signal IN_CNT1B which is enabled to have a logic "low" level in synchronization with a rising edge of the first delayed clock signal CLKD1 if the first delayed chip selection signal CSD1 enabled to have a logic "high" level is inputted. In one example, the first input control signal INTC1B may be enabled if the first rank selection signal CS_R1 (see FIG. 2) is enabled in synchronization with the first edge of the clock signal CLK (see FIG. 2). The inverter IV34<2> may inversely buffer the first input control signal IN_CNT1B to generate a first inverted input control signal IN_CNT1. The logic unit 348<1> may buffer the first inverted input control signal IN_CNT1 to generate a second termination enable signal ODTEN2 while the second termination command ODTCMD2 is enabled to have a logic "high" level. The second termination enable signal ODTEN2 may be enabled if the first input control signal IN_CNT1B is enabled while the second termination command ODTCMD2 is enabled. The pulse generator 348<3> may generate the second termination enable command ODTENCMD2, which is enabled in synchronization with a rising edge of the second delayed clock signal CLKD2 inputted through the buffer 348<2>, if the second termination enable signal ODTEN2 enabled is inputted. Enablement of the second termination enable command ODTENCMD2 means that a pulse is created according to the second termination enable signal ODTEN2.

Figure 7:
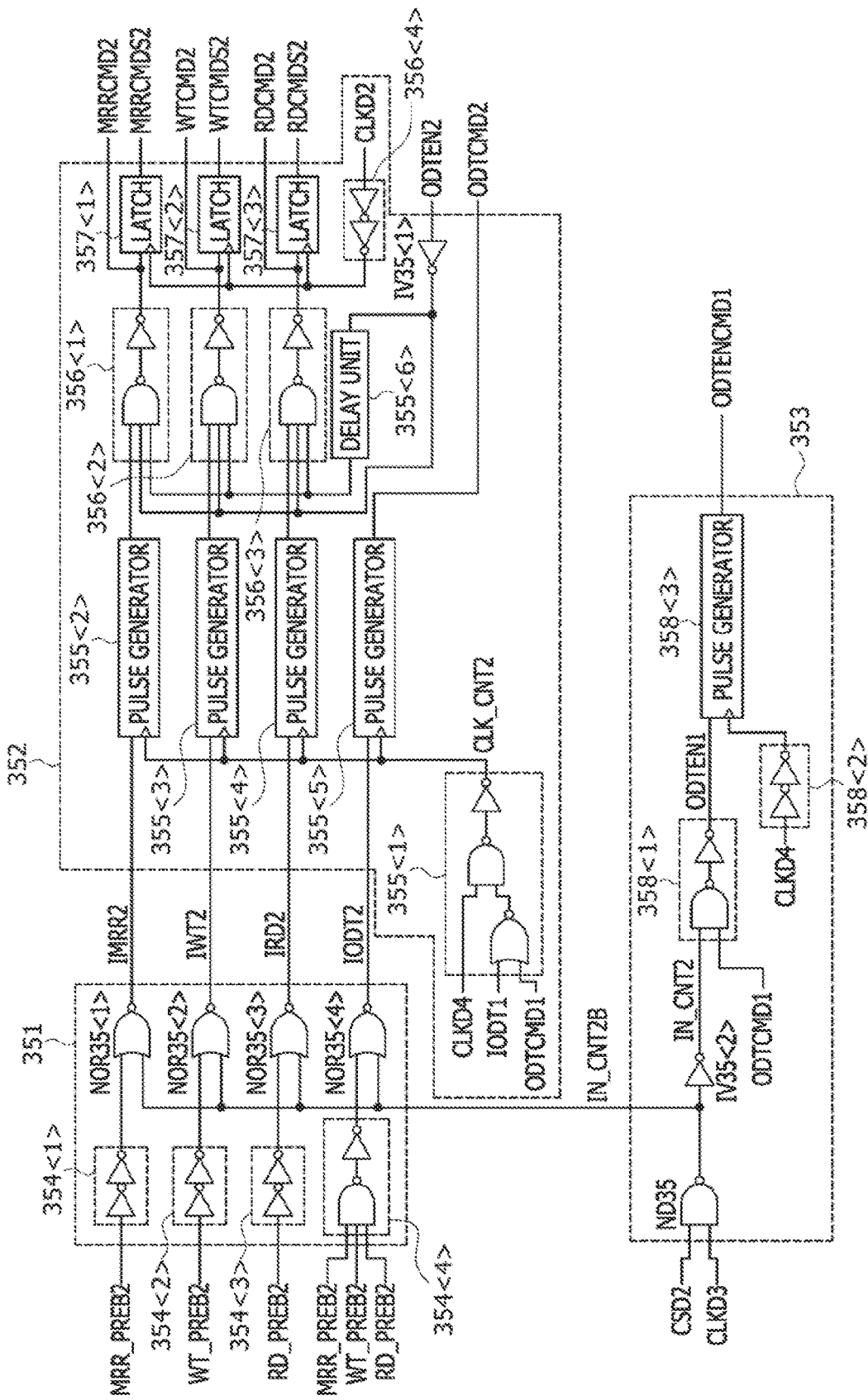
FIG. 7 is a block diagram illustrating a configuration of a second command generation circuit included in the first rank of FIG. 2.

Referring to FIG. 7, the second command generation circuit 35 may include a second internal command generation circuit 351, a second command output circuit 352 and a second input control signal generation circuit 353.

The second internal command generation circuit 351 may include buffers 354<1:4> and NOR gates NOR35<1:4>. The second internal command generation circuit 351 may generate a second internal mode register read command IMRR2, a second internal write command IWT2, a second internal read command IRD2 and the second internal termination command IODT2 from the second pre-mode register read command MRR_PREB2, the second pre-write command WT_PREB2 and the second pre-read command RD_PREB2 while a second input control signal IN_CNT2B is enabled to have a logic "low" level. The second internal command generation circuit 351 may generate the second internal mode register read command IMRR2 and the second internal termination command IODT2 which are enabled to have a logic "high" level if the second pre-mode register read command MRR_PREB2 enabled to have a logic "low" level is inputted while the second input control signal IN_CNT2B is enabled to have a logic "low" level. The second internal command generation circuit 351 may generate the second internal write command IWT2 and the second internal termination command IODT2 which are enabled to have a logic "high" level if the second pre-write command WT_PREB2 enabled to have a logic "low" level is inputted while the second input control signal IN_CNT2B is enabled to have a logic "low" level. The second internal command generation circuit 351 may generate the second internal read command IRD2 and the second internal termination command IODT2 which are enabled to have a logic "high" level if the second pre-read command RD_PREB2 enabled to have a logic "low" level is inputted while the second input control signal IN_CNT2B is enabled to have a logic "low" level.

The second command output circuit 352 may include a second control clock generator 355<1>, pulse generators 355<2:5>, an inverter IV35<1>, a delay unit 355<6>, logic units 356<1:3>, a buffer 356<4> and latches 357<1:3>. The second control clock generator 355<1> may generate a second control clock signal CLK_CNT2 having a logic "high" level while the fourth delayed clock signal CLKD4 has a logic "high" level and the first internal termination command IODT1 and the first termination command ODTCMD1 are disabled to have a logic "low" level. The pulse generators 355<2:4> may output pulses which are created when the second internal mode register read command IMRR2, the second internal write command IWT2 and the second internal read command IRD2, which are enabled, are inputted while the second control clock signal CLK_CNT2 having a logic "high" level is inputted. The pulse generator 355<5> may generate the second termination command ODTCMD2 for execution of the termination operation from a second pre-command, where the second termination command ODTCMD2 may be enabled if an enabled second internal termination command IODT2 is inputted while the second control clock signal CLK_CNT2 having a logic "high" level is inputted. The logic units 356<1:3> may generate the second mode register read command MRRCMD2, the second write command WTCMD2 and the second read command RDCMD2 in response to output signals of the inverter IV35<1> and the delay unit 355<6>. The logic units 356<1:3> may transmit the pulses generated in the pulse generators 355<2:4> to the latches 357<1:3> while the second termination enable signal ODTEN2 is disabled to have a logic "low" level. The logic units 356<1:3> may prevent the pulses generated in the pulse generators 355<2:4> from being transmitted to the latches 357<1:3>, while the second termination enable signal ODTEN2 is enabled to have a logic "high" level. In one example, the second command generation circuit 35 may terminate generation of the second command if the second termination enable signal ODTEN2 is enabled. The latches 357<1:3> may receive the pulses generated in the pulse generators 355<2:4> through the logic units 356<1:3> to generate the second shift mode register read command MRRCMDS2, the second shift write command WTCMDS2 and the second shift read command RDCMDS2, in synchronization with the second delayed clock signal CLKD2. The second command generation circuit 35 may generate the second command and the second termination command ODTCMD2 in response to a second input control signal IN_CNT2B and a second termination enable signal ODTEN2.

The second input control signal generation circuit 353 may include a NAND gate ND35, an inverter IV35<2>, a logic unit 358<1>, a buffer 358<2> and a pulse generator 358<3>. The NAND gate ND35 may generate the second input control signal IN_CNT2B which is enabled to have a logic "low" level in synchronization with a rising edge of the third delayed clock signal CLKD3 if the second delayed chip selection signal CSD2 enabled to have a logic "high" level is inputted. In one example, the second control signal IN_CNT2B may be enabled if the first rank selection signal CS_R1 is enabled in synchronization with the second edge of the clock signal. The inverter IV35<2> may inversely buffer the second input control signal IN_CNT2B to generate a second inverted input control signal IN_CNT2. The logic unit 358<1> may buffer the second inverted input control signal IN_CNT2 to generate the first termination enable signal ODTEN1 while the first termination command ODTCMD1 is enabled to have a logic "high" level. The pulse generator 358<3> may generate the first termination enable command ODTENCMD1 which is enabled in synchronization with a rising edge of the fourth delayed clock signal CLKD4 inputted through the buffer 358<2>, if an enabled first termination enable signal ODTEN1 is inputted. The first termination enable signal ODTEN1 may be enabled if the second input control signal IN_CNT2B is enabled while the first termination command ODTCMD1 is enabled. Enablement of the first termination enable command ODTENCMD1 means that a pulse is created according to the first termination enable signal ODTEN1.

Operations of the first rank 3 illustrated in FIGS. 2 to 7 will be described hereinafter with reference to FIGS. 8 and 9.

Figure 8:
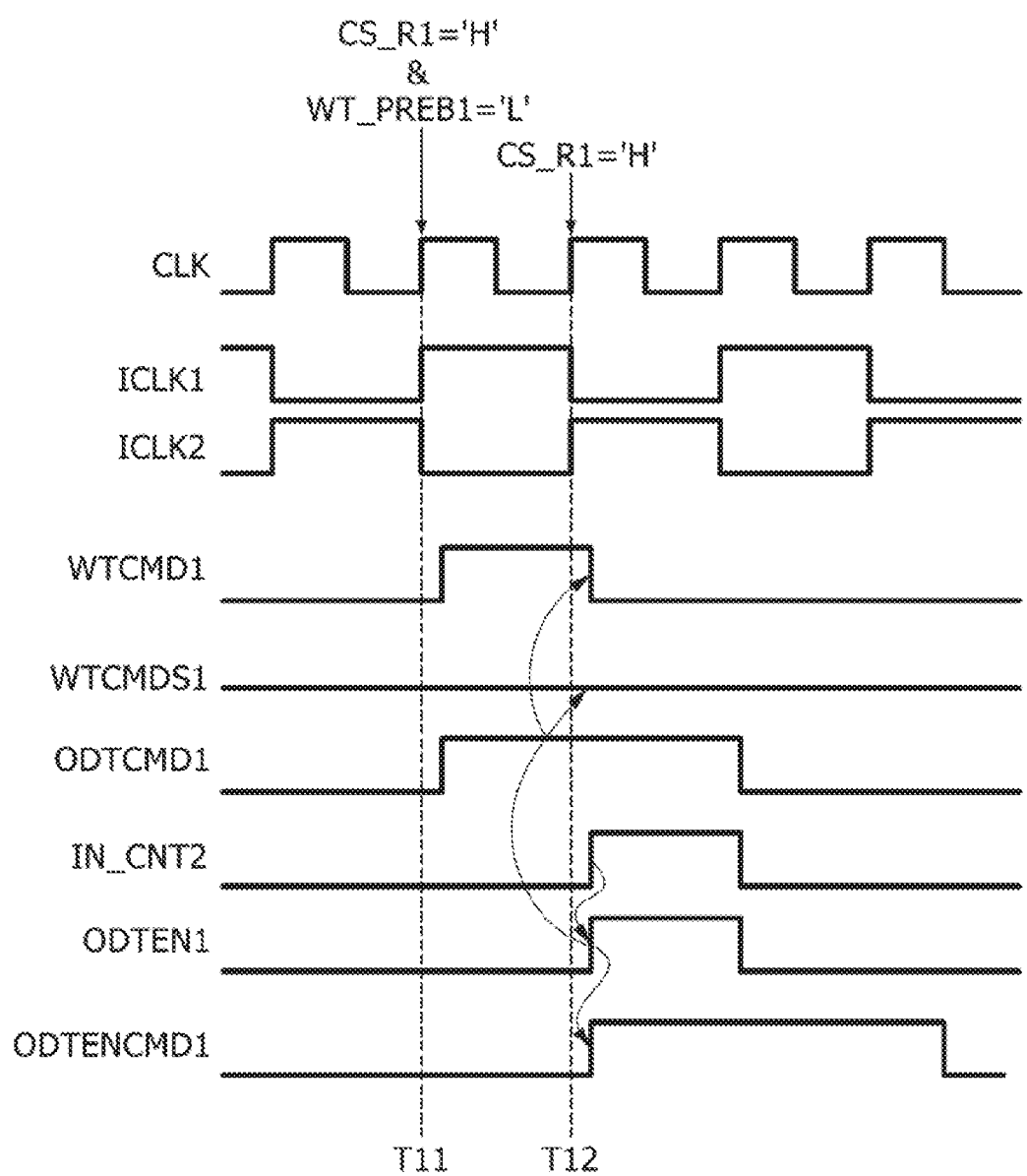
FIGS. 8 and 9 are timing diagrams illustrating operations of the first rank included in the semiconductor device of FIG. 1.

As illustrated in FIG. 8, if the first pre-write command WT_PREB1 enabled to have a logic "low" level is inputted in synchronization with a first rising edge of the clock signal CLK at a point of time "T11" while the first rank selection signal CS_R1 is enabled to have a logic "high" level, the first write command WTCMD1 and the first termination command ODTCMD1, which are enabled to have a logic "high" level, may be generated. The first write command WTCMD1 and the first termination command ODTCMD1 may be generated by the first internal command generation circuit 341 and the first command output circuit 342 included in the first command generation circuit 34 illustrated in FIG. 6. The first termination command ODTCMD1 enabled to have a logic "high" level may terminate a pulse generation operation of the pulse generators 355<2:5> included in the second command generation circuit 35 illustrated in FIG. 7, thereby preventing the second mode register read command MRRCMD2, the second shift mode register read command MRRCMDS2, the second write command WTCMD2, the second shift write command WTCMDS2, the second read command RDCMD2, the second shift read command RDCMDS2 and the second termination command ODTCMD2 from being enabled. If the first rank selection signal CS_R1 maintains a logic "high" level in synchronization with a second rising edge of the clock signal CLK at a point of time "T12", the second inverted input control signal IN_CNT2, the first termination enable signal ODTEN1 and the first termination enable command ODTENCMD1 may be sequentially enabled to have a logic "high" level. The second inverted input control signal IN_CNT2, the first termination enable signal ODTEN1 and the first termination enable command ODTENCMD1 may be generated by the second input control signal generation circuit 353 included in the second command generation circuit 35 illustrated in FIG. 7. The first termination enable signal ODTEN1 enabled to have a logic "high" level may be applied to the first command output circuit 342 included in the first command generation circuit 34 illustrated in FIG. 6 to disable the first write command WTCMD1 and the first shift write command WTCMDS1 to a logic "low" level.

As described above, the first rank 3 may perform only the termination operation without performing the write operation even though the first pre-write command WT_PREB1 enabled to have a logic "low" level is inputted in synchronization with the first rising edge of the clock signal CLK, if the first rank selection signal CS_R1 continuously maintains an enabled state corresponding to a logic "high" level at the first and second rising edges of the clock signal CLK. Although FIG. 8 illustrates an example in which the first pre-write command WT_PREB1 enabled to have a logic "low" level is inputted in synchronization with the first rising edge of the clock signal CLK, the present disclosure is not limited thereto. For example, in some embodiments, the first pre-mode register read command MRR_PREB1 or the first pre-read command RD_PREB1 enabled to have a logic "low" level may be inputted in synchronization with the first rising edge of the clock signal CLK. In such a case, the first rank 3 may perform only the termination operation without performing the mode register read operation or the read operation even though the first pre-mode register read command MRR_PREB1 or the first pre-read command RD_PREB1 enabled to have a logic "low" level is inputted in synchronization with the first rising edge of the clock signal CLK, if the first rank selection signal CS_R1 continuously maintains an enabled state corresponding to a logic "high" level at the first and second rising edges of the clock signal CLK.

Figure 9:
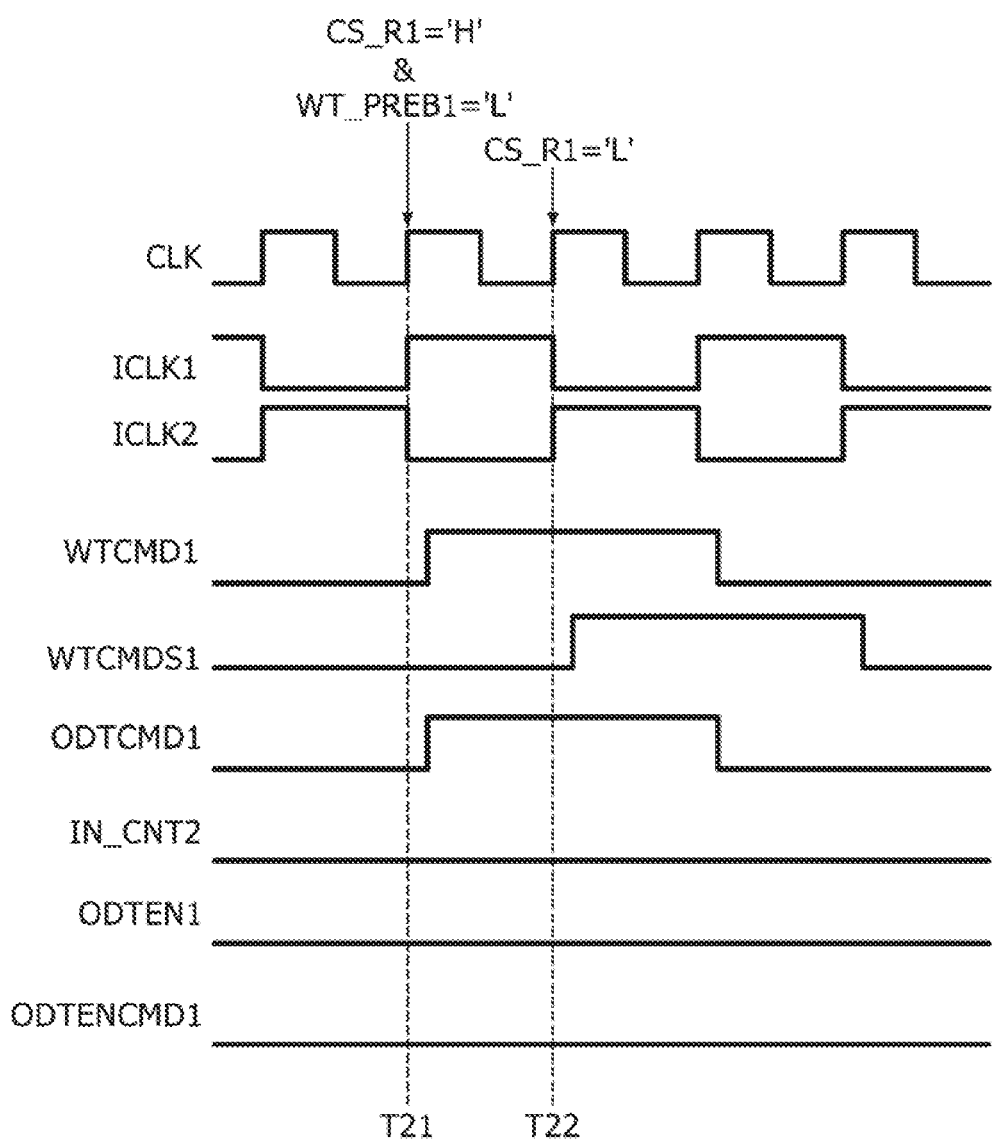

As illustrated in FIG. 9, if the first pre-write command WT_PREB1 enabled to have a logic "low" level is inputted in synchronization with a first rising edge of the clock signal CLK at a point of time "T21" while the first rank selection signal CS_R1 is enabled to have a logic "high" level, the first write command WTCMD1 and the first termination command ODTCMD1, which are enabled to have a logic "high" level, may be generated. The first write command WTCMD1 and the first termination command ODTCMD1 may be generated by the first internal command generation circuit 341 and the first command output circuit 342 included in the first command generation circuit 34 illustrated in FIG. 6. The first termination command ODTCMD1 enabled to have a logic "high" level may terminate a pulse generation operation of the pulse generators 355<2:5> included in the second command generation circuit 35 illustrated in FIG. 7, thereby preventing the second mode register read command MRRCMD2, the second shift mode register read command MRRCMDS2, the second write command WTCMD2, the second shift write command WTCMDS2, the second read command RDCMD2, the second shift read command RDCMDS2 and the second termination command ODTCMD2 from being enabled. If a logic level of the first rank selection signal CS_R1 is changed into a logic "low" level in synchronization with a second rising edge of the clock signal CLK at a point of time "T22", the second inverted input control signal IN_CNT2, the first termination enable signal ODTEN1 and the first termination enable command ODTENCMD1 may maintain a disabled state corresponding to a logic "low" level. Thus, the first termination command ODTCMD1 enabled to have a logic "high" level in synchronization with the point of time "T21" may be shifted to generate the first shift write command WTCMDS1 which is enabled to have a logic "high" level in synchronization with the point of time "T22" for execution of the write operation.

As described above, the first rank 3 may perform the write operation in response to the first pre-write command WT_PREB1 enabled to have a logic "low" level in synchronization with the first rising edge of the clock signal CLK, if the first rank selection signal CS_R1 has a logic "high" level at the first rising edge of the clock signal CLK and the logic level of the first rank selection signal CS_R1 is changed into a logic "low" level in synchronization with the second rising edge of the clock signal CLK. Although FIG. 9 illustrates an example in which the first pre-write command WT_PREB1 enabled to have a logic "low" level is inputted in synchronization with the first rising edge of the clock signal CLK, the present disclosure is not limited thereto. For example, in some embodiments, the first pre-mode register read command MRR_PREB1 or the first pre-read command RD_PREB1 enabled to have a logic "low" level may be inputted in synchronization with the first rising edge of the clock signal CLK. In such a case, the first rank 3 may perform the mode register read operation or the read operation in response to the first pre-mode register read command MRR_PREB1 or the first pre-read command RD_PREB1 enabled to have a logic "low" level in synchronization with the first rising edge of the clock signal CLK, if the first rank selection signal CS_R1 has a logic "high" level at the first rising edge of the clock signal CLK and the logic level of the first rank selection signal CS_R1 is changed into a logic "low" level in synchronization with the second rising edge of the clock signal CLK.

An operation of the semiconductor device according to an embodiment will be described hereinafter with reference to FIG. 10.

Figure 10:
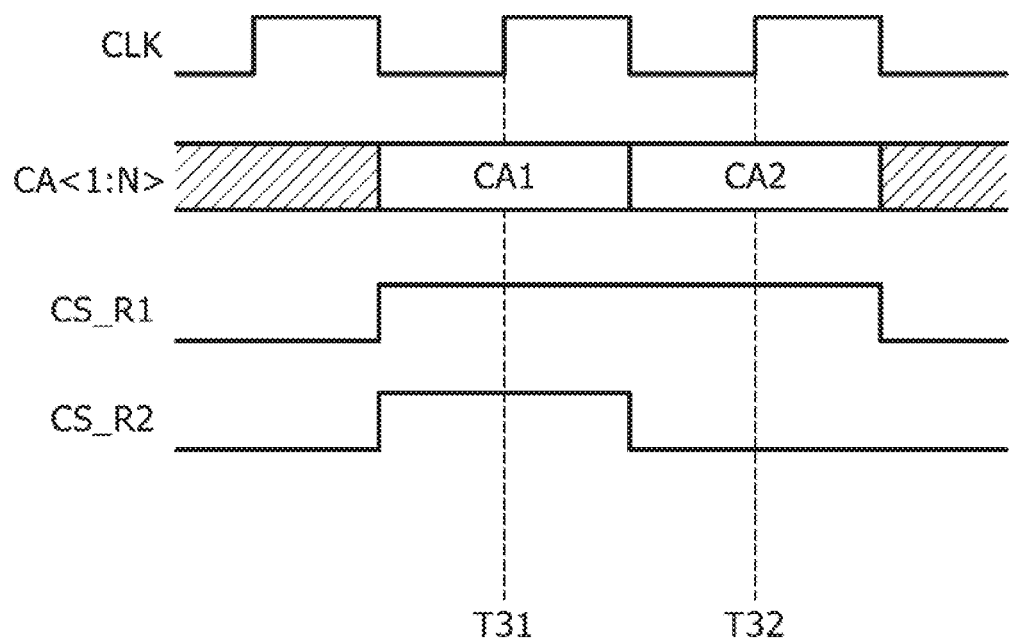
FIG. 10 is a timing diagram illustrating an operation of a semiconductor device according to an embodiment.

As illustrated in FIG. 10, if both of the first and second rank selection signals CS_R1 and CS_R2 have a logic "high" level at a first rising edge (i.e., a point of time "T31") of the clock signal CLK and the first and second rank selection signals CS_R1 and CS_R2 respectively have a logic "high" level and a logic "low" level at a second rising edge (i.e., a point of time "T32") of the clock signal CLK, the first rank 3 may perform only the termination operation without performing the internal control operation and the second rank 4 may perform only one of the mode register read operation, the read operation and the write operation. The first rank 3 may possibly not perform the internal control operation (i.e., the mode register read operation, the read operation or the write operation) in response to a first level combination CA1 of the command/address signal CA<1:N> inputted at the first rising edge (i.e., the point of time "T31") of the clock signal CLK and may perform only the termination operation in response to a second level combination CA2 of the command/address signal CA<1:N> inputted at the second rising edge (i.e., the point of time "T32") of the clock signal CLK. The second rank 4 may perform one of the mode register read operation, the read operation and the write operation in response to the first level combination CA1 of the command/address signal CA<1:N> inputted at the first rising edge (i.e., the point of time "T31") of the clock signal CLK.

Each of the ranks included in the semiconductor device according to an embodiment may perform only the termination operation without performing or blocking the internal control operation (i.e., the mode register read operation, the read operation or the write operation) in response to the command/address signal CA<1:N>, if a rank selection signal having a logic "high" level is continuously inputted at the rising edges of the clock signal CLK which are sequentially created. Because the semiconductor device according to the embodiment performs the termination operation in response to the command/address signal CA<1:N>, an additional pin may possibly not be required to receive a control signal for the termination operation. Moreover, the semiconductor device according to an embodiment may block generation of an unnecessary internal command during the termination operation to prevent malfunction of the semiconductor device. Accordingly, power consumption of the semiconductor device may be reduced.

Figure 11:
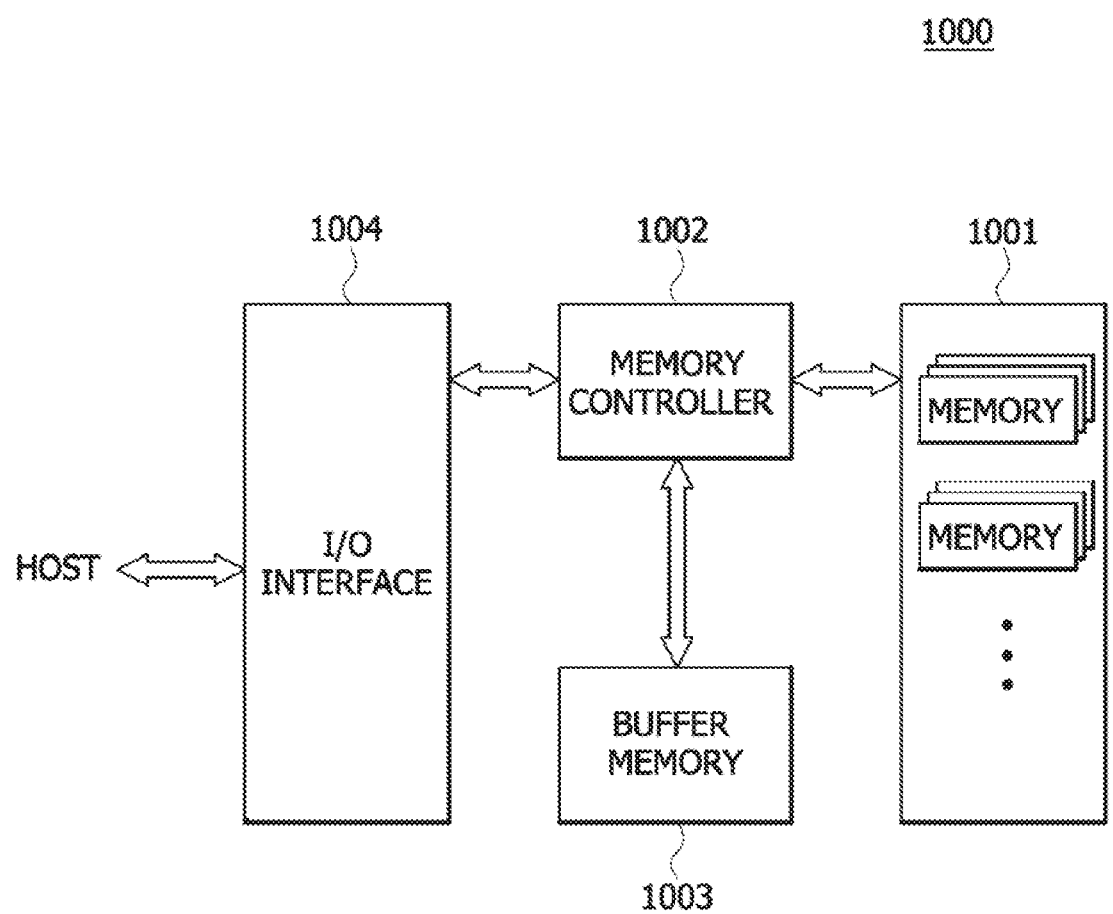
FIG. 11 is a block diagram illustrating a configuration of an electronic system employing the semiconductor device shown in FIG. 1.

The semiconductor device described with reference to FIGS. 1 to 10 may be applied to an electronic system that includes a memory system, a graphic system, a computing system, a mobile system, or the like. For example, as illustrated in FIG. 11, an electronic system 1000 according an embodiment may include a data storage circuit 1001, a memory controller 1002, a buffer memory 1003, and an input/output (I/O) interface 1004.

The data storage circuit 1001 may store data which are outputted from the memory controller 1002 or may read and output the stored data to the memory controller 1002, according to a control signal generated from the memory controller 1002. The data storage circuit 1001 may include the semiconductor device 1 illustrated in FIG. 1. Meanwhile, the data storage circuit 1001 may include a nonvolatile memory that can retain stored data of the data storage circuit

1001 even when its power supply is interrupted. The nonvolatile memory may be a flash memory such as a NOR-type flash memory or a NAND-type flash memory, a phase change random access memory (PRAM), a resistive random access memory (RRAM), a spin transfer torque random access memory (STTRAM), a magnetic random access memory (MRAM), or the like.

The memory controller 1002 may receive a command outputted from an external device (e.g., a host device) through the I/O interface 1004 and may decode the command outputted from the host device to control an operation for inputting data into the data storage circuit 1001 or the buffer memory 1003 or for outputting the data stored in the data storage circuit 1001 or the buffer memory 1003. Although FIG. 11 illustrates the memory controller 1002 with a single block, however, the memory controller 1002 may include one controller for controlling the data storage circuit 1001 comprised of a nonvolatile memory and another controller for controlling the buffer memory 1003 comprised of a volatile memory.

The buffer memory 1003 may temporarily store data which is processed by the memory controller 1002. That is, the buffer memory 1003 may temporarily store data which is outputted from or to be inputted to the data storage circuit 1001. The buffer memory 1003 may store data, which is outputted from the memory controller 1002, according to a control signal. The buffer memory 1003 may read and output the stored data to the memory controller 1002. The buffer memory 1003 may include a volatile memory such as a dynamic random access memory (DRAM), a mobile DRAM, or a static random access memory (SRAM).

The I/O interface 1004 may physically and electrically connect the memory controller 1002 to the external device (i.e., the host). Thus, the memory controller 1002 may receive control signals and data supplied from the external device (i.e., the host) through the I/O interface 1004 and may output the data generated from the memory controller 1002 to the external device (i.e., the host) through the I/O interface 1004. That is, the electronic system 1000 may communicate with the host through the I/O interface 1004. The I/O interface 1004 may include any one of various interface protocols such as a universal serial bus (USB), a multimedia card (MMC), a peripheral component interconnect-express (PCI-E), a serial attached SCSI (SAS), a serial AT attachment (SATA), a parallel AT attachment (PATA), a small computer system interface (SCSI), an enhanced small device interface (ESDI) and an integrated drive electronics (IDE).

The electronic system 1000 may be used as an auxiliary storage device of the host or an external storage device. The electronic system 1000 may include a solid state disk (SSD), a USB memory, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded multi-media card (eMMC), a compact flash (CF) card, or the like.

According to the above embodiments, a semiconductor device may perform a termination operation using a command/address signal even without an additional pin. Thus, the number of pins of the semiconductor device may be reduced.

Moreover, the semiconductor device according to the embodiments may suppress generation of internal commands for execution of a mode register read operation, a read operation and a write operation during a termination operation to prevent malfunction of the semiconductor device and to reduce power consumption of the semiconductor device.

What is claimed is:

1. A semiconductor device comprising:
 a first rank configured to operate in synchronization with a clock signal in response to a first rank selection signal; and
 a second rank configured to operate in synchronization with the clock signal in response to a second rank selection signal,
 wherein the first rank performs a termination operation by blocking an internal control operation if both a value of the first rank selection sampled by a first edge of the clock signal and a value of the first rank selection sampled by a second edge of the clock signal have an enabled state.

2. The semiconductor device of claim 1, wherein the first edge and the second edge of the clock signal have the same polarity and are created continuously.

3. The semiconductor device of claim 1, wherein the internal control operation includes at least one of a mode register read operation, a read operation and a write operation.

4. The semiconductor device of claim 1, wherein the first rank receives a command/address signal in synchronization with the first edge and the second edge of the clock signal.

5. The semiconductor device of claim 1, wherein the first rank performs the internal control operation based on a pre-command inputted in synchronization with the first edge of the clock signal, if the first rank selection signal has the enabled state at the first edge of the clock signal and has a disabled state at the second edge of the clock signal.

6. The semiconductor device of claim 1, wherein the first rank comprising:
 a first command generation circuit configured to generate a first command for execution of the internal control operation and a first termination command for execution of the termination operation based on a first pre-command, in response to a first input control signal and a first termination enable signal; and
 a second command generation circuit configured to generate a second command for execution of the internal control operation and a second termination command for execution of the termination operation based on a second pre-command, in response to a second input control signal and a second termination enable signal.

7. The semiconductor device of claim 6, wherein
 the first input control signal is enabled when the first rank selection signal is enabled in synchronization with the first edge of the clock signal, and
 the second input control signal is enabled when the first rank selection signal is enabled in synchronization with the second edge of the clock signal.

8. The semiconductor device of claim 6, wherein the first termination enable signal is enabled when the second input control signal is enabled while the first termination command is enabled.

9. The semiconductor device of claim 8, wherein the first command generation circuit deactivates the first command when the first termination enable signal is enabled.

10. The semiconductor device of claim 6, wherein
 the first pre-command includes at least one of a first pre-mode register read command, a first pre-write command and a first pre-read command, and the first command includes at least one of a first mode register read command, a first write command and a first read command.

11. A semiconductor device comprising:
a first rank configured to operate in synchronization with a clock signal in response to a first rank selection signal; and
a second rank configured to operate in synchronization with the clock signal in response to a second rank selection signal,
wherein the first rank performs a termination operation by blocking an internal control operation if the first rank selection signal is maintained at an enabled state during an interval including a first edge and a second edge of the clock signal, and
the first edge and the second edge of the clock signal have the same polarity and are created continuously.

12. The semiconductor device of claim 11, wherein the internal control operation includes at least one of a mode register read operation, a read operation and a write operation.

13. The semiconductor device of claim 12, wherein the first rank receives a command/address signal in synchronization with the first edge and the second edge of the clock signal.

14. The semiconductor device of claim 12, wherein the first rank performs the internal control operation based on a pre-command inputted in synchronization with the first edge of the clock signal, if the first rank selection signal has the enabled state at the first edge of the clock signal and has a disabled state at the second edge of the clock signal.

15. The semiconductor device of claim 12, wherein the first rank comprising:
a first command generation circuit configured to generate a first command for execution of the internal control operation and a first termination command for execution of the termination operation based on a first pre-command, in response to a first input control signal and a first termination enable signal; and
a second command generation circuit configured to generate a second command for execution of the internal control operation and a second termination command for execution of the termination operation based on a second pre-command, in response to a second input control signal and a second termination enable signal.

16. The semiconductor device of claim 15, wherein
the first input control signal is enabled when the first rank selection signal is enabled in synchronization with the first edge of the clock signal, and
the second input control signal is enabled when the first rank selection signal is enabled in synchronization with the second edge of the clock signal.

17. The semiconductor device of claim 15, wherein the first termination enable signal is enabled when the second input control signal is enabled while the first termination command is enabled.

18. The semiconductor device of claim 17, wherein the first command generation circuit deactivates the first command when the first termination enable signal is enabled.

19. The semiconductor device of claim 15, wherein
the first pre-command includes at least one of a first pre-mode register read command, a first pre-write command and a first pre-read command, and
the first command includes at least one of a first mode register read command, a first write command and a first read command.

20. A semiconductor device comprising:
an input circuit configured to receive an clock signal provided by an external device;
a first rank configured to operate in synchronization with the clock signal in response to a first rank selection signal; and
a second rank configured to operate in synchronization with the clock signal in response to a second rank selection signal,
wherein the first rank performs a termination operation without performing a memory access operation when the first rank selection signal is maintained at an enabled state during two cycles of the clock signal.

21. The semiconductor device of claim 20, wherein the first rank performs the memory access operation, if the first rank selection signal has an enabled state at a first edge of the clock signal and has a disabled state at a second edge of the clock signal, and
the first edge and the second edge of the clock signal have the same polarity and are created continuously.

22. The semiconductor device of claim 20, wherein the first rank blocks the memory access operation when the first rank selection signal is maintained at the enabled state during two cycles of the clock signal.

23. The semiconductor device of claim 21, wherein the memory access operation includes at least one of a read operation and a write operation.

24. The semiconductor device of claim 21, wherein the first rank receives a command/address signal in synchronization with the first edge and the second edge of the clock signal.

25. A semiconductor device comprising:
a first rank configured to operate in synchronization with an external clock signal in response to a first rank selection signal; and
a second rank configured to operate in synchronization with the external clock signal in response to a second rank selection signal,
wherein the first rank performs a termination operation by blocking an internal control operation if a value of the first rank selection sampled by a first edge of the external clock signal is the same with a value of the first rank selection sampled by a second edge of the external clock signal, and
the first edge and the second edge of the external clock signal have the same polarity and are created continuously.

26. The semiconductor device of claim 25, wherein the first rank performs the termination operation by blocking the internal control operation when the first rank selection signal has the enabled state during the interval of the first edge and the second edge of the external clock signal.

27. The semiconductor device of claim 25, wherein the first rank performs the internal control operation when the first rank selection signal has the enabled state at the first edge of the external clock signal and has a disabled state at the second edge of the external clock signal.

28. A semiconductor device comprising:
a first rank configured to operate in synchronization with a clock signal in response to a first rank selection signal; and
a second rank configured to operate in synchronization with the clock signal in response to a second rank selection signal,
wherein the first rank performs a termination operation when the first rank selection signal is maintained at an enabled state during an interval of a first edge and a second edge of the clock signal, the first rank performs an internal control operation when the first rank selection signal has the enabled state at the first edge of the clock signal and has a disabled state at the second edge of the clock signal, and the first edge and the second edge of the clock signal have a same polarity and are created continuously.

29. The semiconductor device of claim 28, wherein the internal control operation includes at least one of a mode register read operation, a read operation and a write operation.

30. The semiconductor device of claim 28, wherein the first rank receives a command/address signal in synchronization with the first edge and the second edge of the clock signal.

31. A semiconductor device comprising:

an input circuit configured to receive an clock signal provided by an external device;

a first rank configured to operate in synchronization with the clock signal in response to a first rank selection signal; and a second rank configured to operate in synchronization with the clock signal in response to a second rank selection signal, wherein the first rank performs a termination operation by blocking a memory access operation when the first rank selection signal is maintained at an enabled state during two cycles of the clock signal.

32. A semiconductor device comprising:

a first rank configured to operate in synchronization with a clock signal in response to a first rank selection signal; and a second rank configured to operate in synchronization with the clock signal in response to a second rank selection signal, wherein the first rank performs a termination operation by blocking a memory access operation if both a value of the first rank selection sampled by a first edge of the clock signal and a value of the first rank selection sampled by a second edge of the clock signal have an enabled state.

* * * * *